(12) United States Patent
Yamaguchi

(10) Patent No.: US 6,558,158 B2
(45) Date of Patent: May 6, 2003

(54) CERAMIC HEATER

(75) Inventor: Shinji Yamaguchi, Ama-gun (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 09/976,464

(22) Filed: Oct. 12, 2001

(65) Prior Publication Data
US 2002/0102512 A1 Aug. 1, 2002

(30) Foreign Application Priority Data
Oct. 19, 2000 (JP) ......................................... 2000-319461

(51) Int. Cl.$^7$ ................................................. F27D 5/00
(52) U.S. Cl. ...................... 432/258; 432/259; 392/418; 118/728; 118/725
(58) Field of Search ................................ 432/253, 258, 432/259; 211/41.18; 206/454; 392/416, 418; 438/795; 118/722, 724, 725, 728

(56) References Cited

U.S. PATENT DOCUMENTS 4,518,848 A * 5/1985 Weber .......................... 432/11
5,478,401 A 12/1995 Tsunekawa et al.
5,904,872 A * 5/1999 Arami et al. ................. 219/465
6,204,489 B1 * 3/2001 Katsuda et al. .............. 118/725
6,286,451 B1 * 9/2001 Ishikawa et al. ............. 118/724
6,394,797 B1 * 5/2002 Sugaya et al. ............... 432/253

FOREIGN PATENT DOCUMENTS

| EP | 0 644 577 | 3/1995 |
| EP | 0 929 205 | 7/1999 |
| EP | 0 993 024 | 4/2000 |
| JP | 9-171953 | 6/1997 |

* cited by examiner

Primary Examiner—Gregory Wilson
(74) Attorney, Agent, or Firm—Burr & Brown

(57) ABSTRACT

A ceramic heater (1) includes a ceramic substrate (2) having a heating surface (2a) for supporting and heating an object to be processed, a hearing element (6) provided in the substrate (2), and embossed portions (4) on the heating surface (2a) which contact the object. The number of the embossed portions (4) per unit area on the heat spot (3) is less than that on the rest of the heating surface (2a). When the average temperature of the heating surface (2a) is raised to reach a target temperature, the heat spot (3) having relatively high surface temperatures exists on the heating surface (2a).

12 Claims, 7 Drawing Sheets

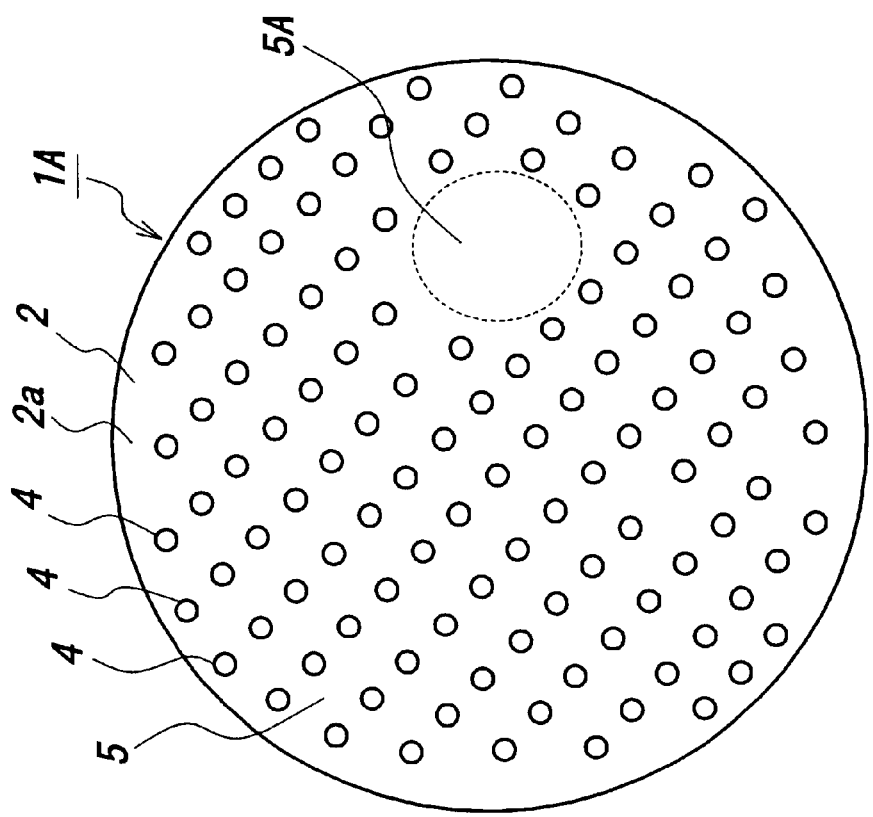
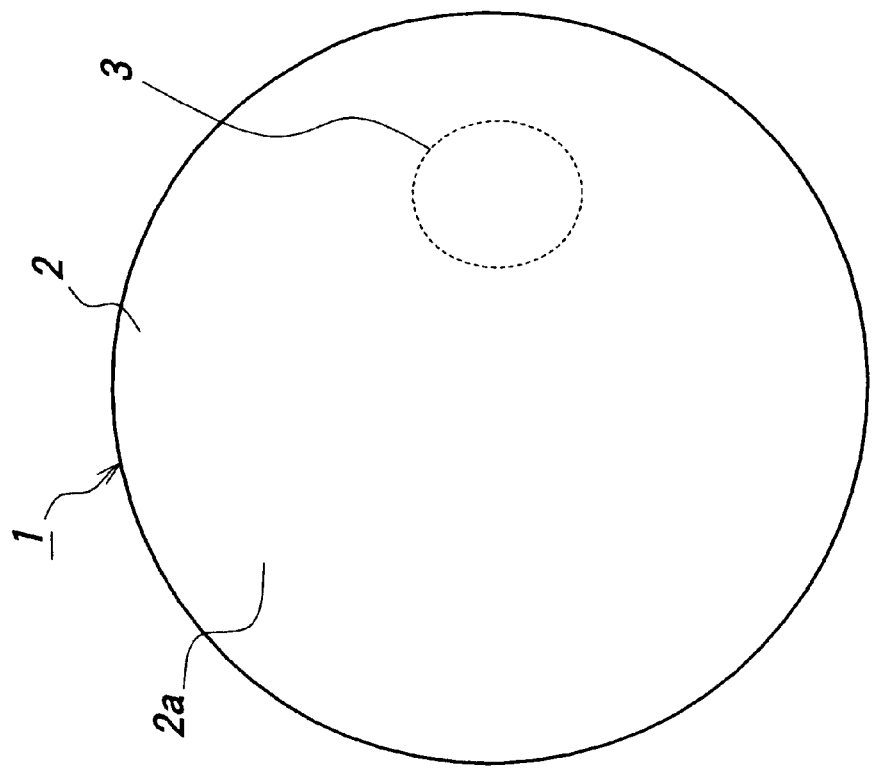

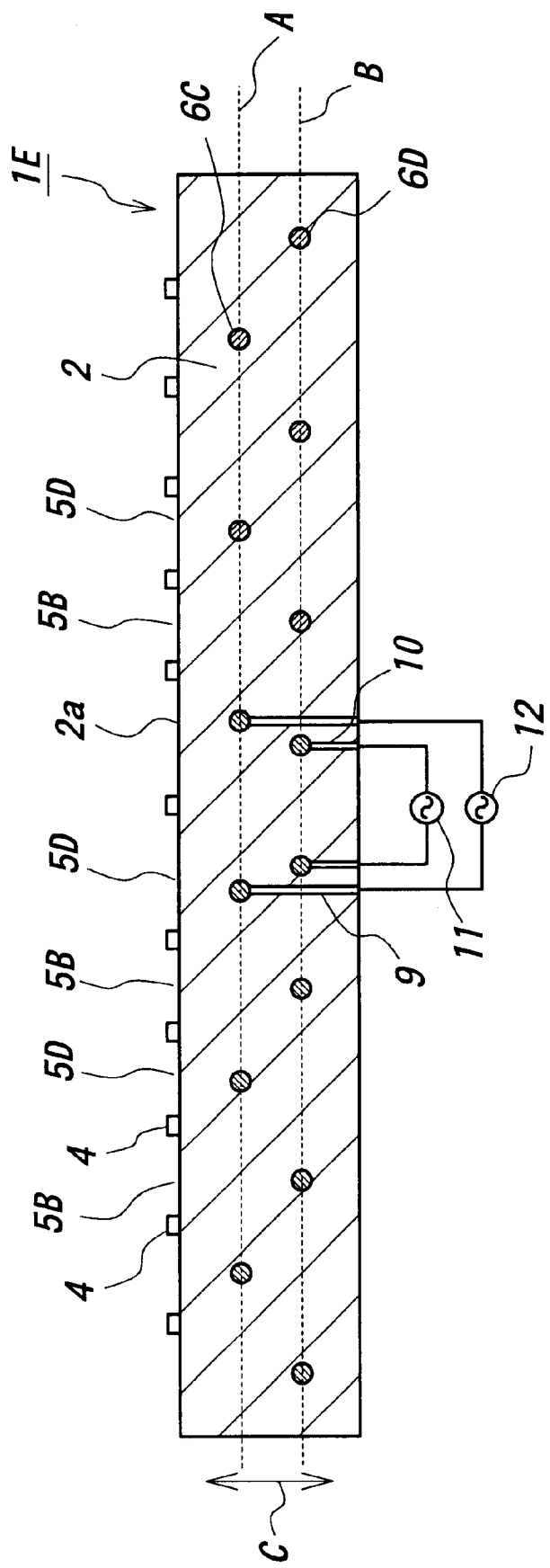

CERAMIC HEATER

BACKGROUND OF THE INVENTION

1. Field of the Invention

The present invention relates to a ceramic heater.

2. Description of the Related Art

The semiconductor-producing apparatus is equipped with a ceramic heater to heat wafers, which are substrates, for manufacturing semiconductor films from raw material gases such as silane gas by thermal CVD or the like.

A configuration so-called a dual zone heater is known as a ceramic heater. For the dual zone heater, an inner resistance-heating element and an outer resistance-heating element each comprising a high-melting point metal such as molybdenum are buried in a ceramic substrate. Separate current-introducing terminals are connected to the respective resistance-heating elements, and the inner resistance-heating element and the outer heating element are independently controlled by applying a given voltage to each resistance-heating element.

For example, in an application for heating semiconductor wafers, controlling the temperature throughout the heating surface uniformly is necessary, and it is a demand that strict specifications are satisfied, such as temperature differences being within ±5° C. throughout the heating surface under a use condition. However, a so-called heat spot may practically occur on the heating surface. Occurrence of the heat spot tends to significantly increase when a target temperature of the beating surface is not less than 500° C., and further not less than 600° C. The occurrence of the heat spot may cause a variation in thickness of the semiconductor film at the heat spot.

The inventors further studied and found that when the semiconductor wafer is provided on the ceramic hearer and a semiconductor film is formed thereon, an identical pattern of the semiconductor film, for example, as a spiral resistance-heating wire buried in the substrate of the ceramic heater may appear on the semiconductor wafer. Such a pattern shows that a pattern of the heat spot is occurring on the heating surface corresponding to the pattern of the resistance-heating element by an effect of the resistance-heating element buried in the substrate.

It is an object of the present invention to provide a ceramic heater comprising a ceramic substrate having a heating surface for supporting and heating an object to be processed, a heating element provided in the substrate, and embossed portions on the heating surface which are to contact with the object thereby preventing an adverse effect on the object caused by a heat spot on the hearing surface.

SUMMARY OF THE INVENTION

The present Invention relates to a ceramic heater including a ceramic substrate having a heating surface for supporting and heating an object to be processed, a heating element provided in the substrate, and embossed portions on the heating surface which are to contact the object. A heat spot having a relatively high surface temperature will exist on the heating surface when an average temperature of the heating surface is raised to reach a target temperature and the number of the embossed portions per unit area on the heat spot is less than that on the rest of the heating surface, The present invention also relates to a ceramic heater including a ceramic substrate having a heating surface for supporting and hearing an object to be processed, a heating element provided in the substrate, and embossed portions on the heating surface which are to contact with the object. The heating element is buried in a planar form in the substrate and when the heating element is projected on the heating surface In a direction perpendicular to the hearing surface, the number of the embossed portions per unit area on the projected heating element is less than that on the rest of the heating surface.

The present invention further relates to a ceramic beater including a ceramic substrate having a heating surface for supporting and heating an object to be processed, and a heating element provided in the substrate, wherein a hollow space is provided between the heating surface and the heating element in the substrate and a plurality of heat conductors are provided in the space to transverse the space.

A form of placing the heating element in the substrate is not restricted. Preferably, the heating element is buried in the substrate, but it can be provided on the surface of the substrate opposed to the heating surface.

BRIEF DESPRIPTION OF THE DRAWINGS

For a better understanding of the invention, reference is made to the accompanying drawings, wherein:

FIG. 1(*a*) shows an example of a pattern of a heat spot on a ceramic heater;

FIG. 1(*b*) is a plane view showing a form of a heating surface 2*a* of a ceramic heater 1A;

FIG. 6 is a longitudinal sectional view of a ceramic heater 1E;

FIG. 7(*b*) is a longitudinal sectional view of the ceramic heater 1C.

DETAILED DESCRIPTION OF THE INVENTION

Figure 2:
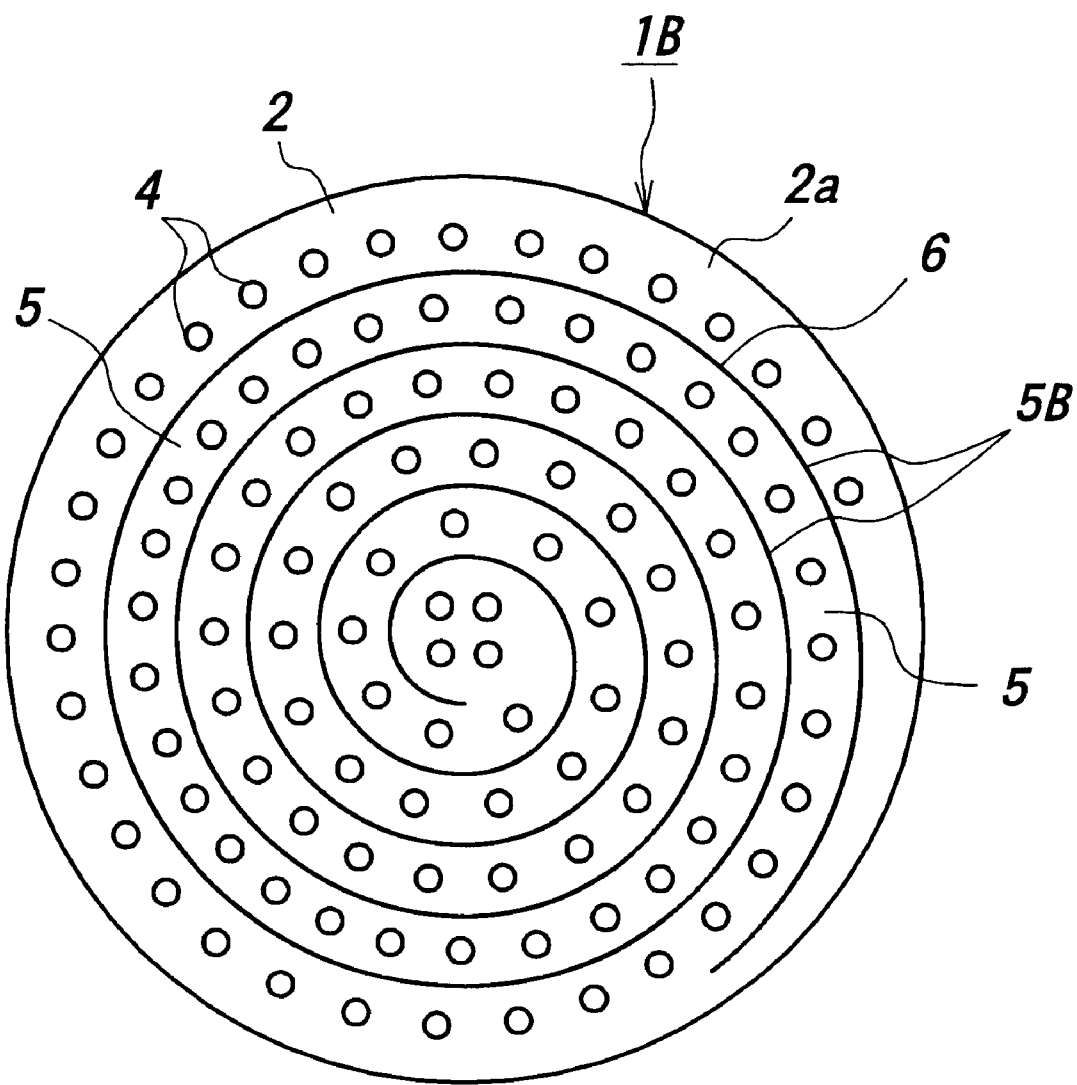
FIG. 2 is a plane view of a ceramic heater 1B.

The present inventors conceived to arrange embossed portions on a heating surface to place a heat spot in a void space between the embossed portions while no embossed portion is provided on the heat spot, thereby preventing the heat spot from contacting with an objects to be processed and acquiring air gaps between the healing surface and the objects. As a result, pressures in the gaps are equal to an interior pressure of a chamber. The pressure is usually low so that heat conduction from the heat spot to the objects is inhibited and temperature distributions of The objects become uniform. Thus, an adverse effect of the heat spot on the objects can be prevented.

FIG. 1(*a*) is a plane view showing a position of the heat spot 3 on the ceramic heater 1, and FIG. 1(*b*) is a plane view of the ceramic heater 1A after fabricating the embossed portions as viewed from a side of a heating surface 2*a*.

A substrate 2 of the ceramic heater 1A is, for example, a disk, and one of main faces of the substrate 2 constitute the heating surface 2*a*. The heat spot 3 occurs on the heating surface 2*a* at a target temperature. The target temperature herein means a maximum temperature to be reached during a treatment of the object.

When a number of the embossed portions 4 are fabricated on the heating surface 2a according to the present invention, the embossed portions are arranged to place the heat spot 3 in the void spaces 5 and 5A between the embossed portions.

In the present invention, the number of the embossed portions per unit area on the hear spot is set to be less tan that on the rest of the beating surface. A ratio of the number of The embossed portions per unit area on the beat spot to the number of the embossed portions per unit area on the rest of the heating surface is preferably less than ⅓ to acquire the effect of the present invention. In a most preferred embodiment of the present invention, the embossed portions are arranged to place the beat spot in the void space between the embossed portions, while no embossed portion is provided on the heat spot.

In a preferred embodiment of the present invention, the heating element is buried in a planar form in the substrate. When the heating element is projected on the heating surface in a direction perpendicular to the heating surface, the embossed portions are fabricated on void spaces of the heating element. FIG. 2 shows a heater representing this embodiment.

In the ceramic heater 1B shown in FIG. 2, a pattern of the heat spot corresponding to a pattern of a heating element 6 buried in the substrate appears on the heating surface. Accordingly, the embossed portions 4 are arranged not to be above the heating element 6 on the heating surface 2a. That is, when the heating element 6 is projected on the heating surface in a direction perpendicular to the heating surface, no embossed portion exists on an area in which the heating element 6 exist, while the area in which the heating element 6 exists is located on the spaces 5B between the embossed portions.

In the present invention, the number of the embossed portions per unit area above the heating element is set to be less than that on the rest of the heating surface. A ratio of the number of the embossed portions per unit area above the heating element to the number of the embossed portions per unit area on the rest of the heating surface is preferably less than ⅓ to acquire the effect of the present invention, In a most preferred embodiment of the present invention, the embossed portions are arranged to place the heating element in the void space between the embossed portions, while no embossed portion is provided above the heating element.

In another preferred embodiment of the present invention, a plurality of heating elements are buried in the substrate. Each of the heating elements is buried along each of respectively corresponding planes. When the heating elements are projected on the heating surface in a direction perpendicular to the heating surface, they overlap each other to exist nearly in the same position.

Figure 3:
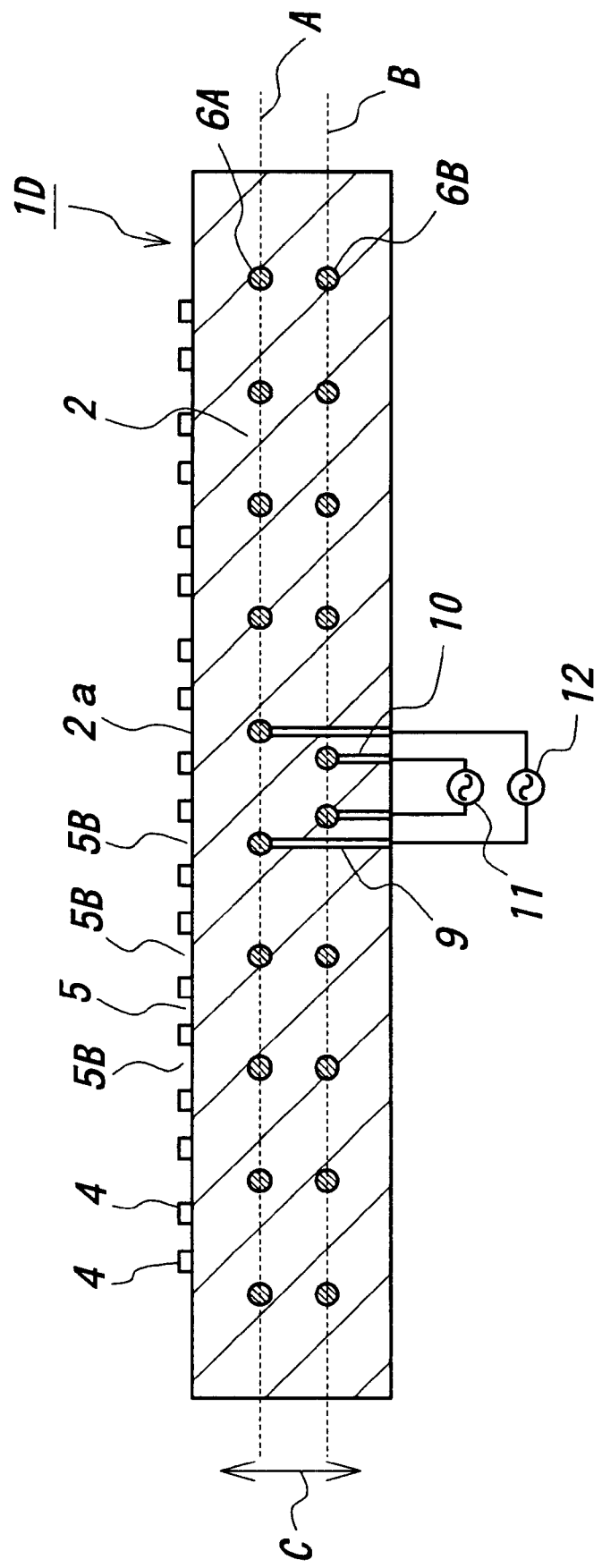
FIG. 3 is a longitudinal sectional view of a ceramic heater 1D.

The ceramic heater 1D shown in FIG. 3 represents the above embodiment. A plurality of, for example, two lines of heating elements 6A and 6B are buried in the substrate 2. Each of the heating elements 6A and 6B is buried in the substrate to stretch along a plane A or B, respectively, which planes are parallel to each other. Each of the heating elements 6A and 6B is connected to an electric power source 11 or 12 via a terminal 9 or 10, respectively.

Figure 4:
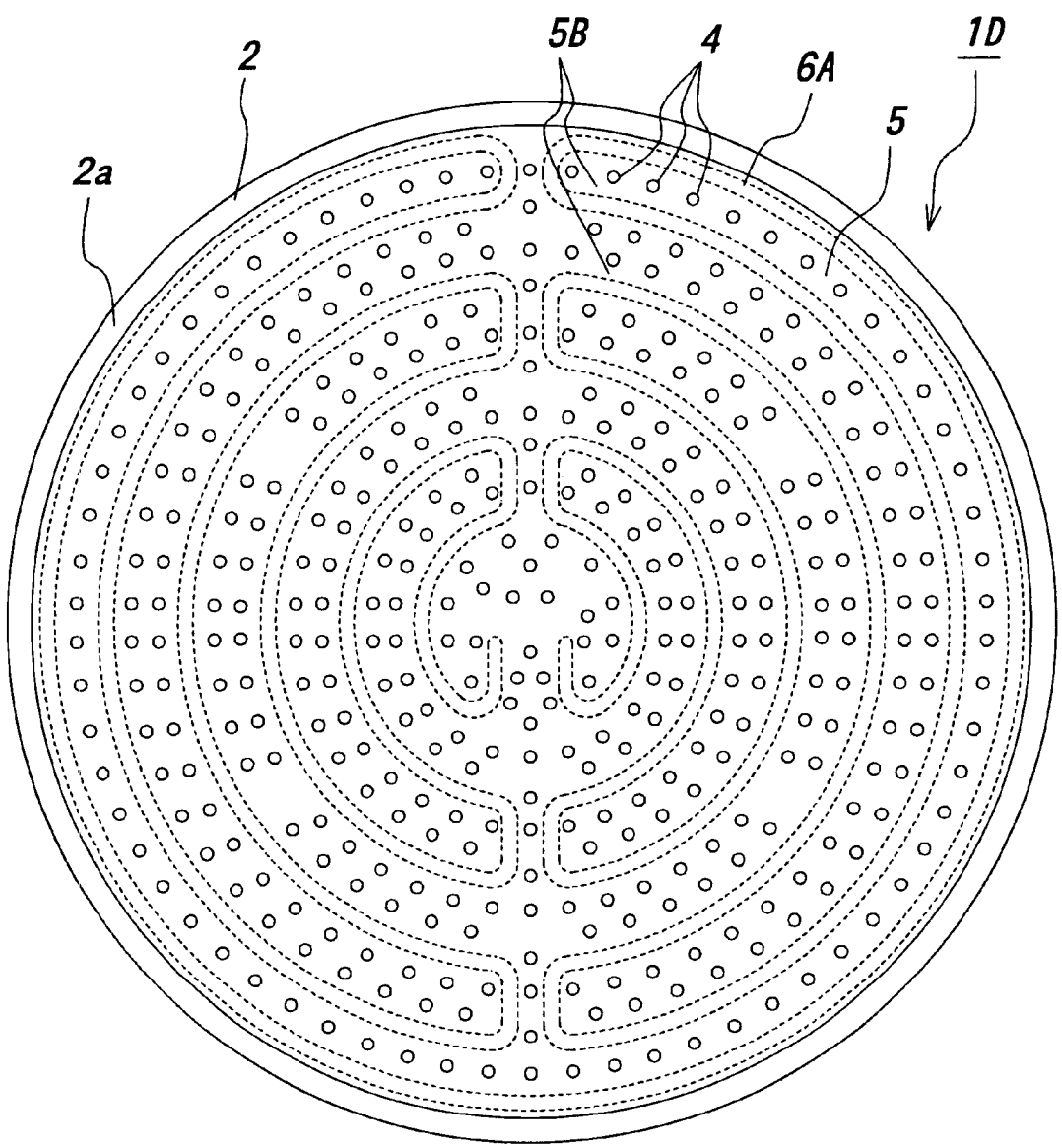
FIG. 4 is a plane view of a heating surface of the ceramic heater 1D showing a pattern of a heating element 6A with dotted lines.

FIG. 4 is a plane view of the substrate 2 as viewed from the side of the heating surface 2a showing a two-dimensional pattern of the heating element 6A with a dotted line. The dotted line is a patter of the heating element 6A when the heating element 6A is projected on the heating surface 2a in a direction C perpendicular to the heating surface 2a. The embossed portions 4 are not fabricated on the area in which the heating element 6A exists. The area in which the projected heating element 6A exists is located on the space 5B between the embossed portions 4.

Figure 5:
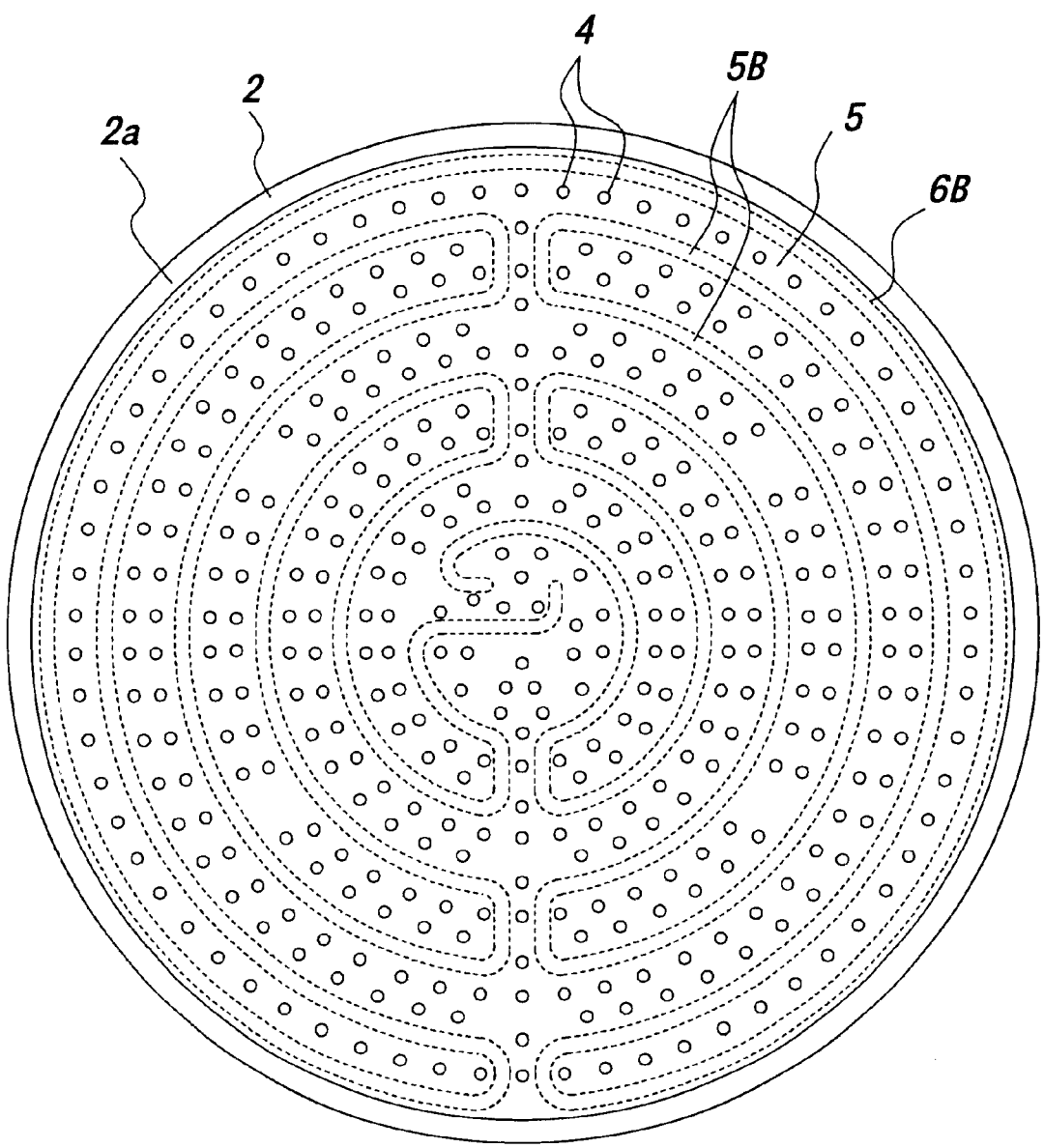
FIG. 5 is a plane view of the heating surface of the ceramic heater 1D showing a pattern of a heating element 6B with dotted lines.

FIG. 5 is a plane view of the substrate 2 as viewed from the side of the heating surface 2a showing a two-dimensional pattern of the heating element 6B with a dotted line. The dotted line is a pattern of the heating element 6B when the heating element 6A is projected on the heating surface 2a in a direction C perpendicular to the heating surface 2a. The embossed portions 4 are not fabricated on the area in which the projected heating element 6B exists. The area in which the projected heating element 6B exists is located on the space 5B between the embossed portions 4.

In this embodiment, when the heating elements 6A and 6B are projected on the heating surface 2a in a direction C perpendicular to the heating surface 2a, the projected heating elements 6A and 6B overlap each other to exist nearly in the same position. Moreover, according to the present invention, when each of the heating elements 6A and 6B is projected on the heating surface 2a, the embossed portions 4 do not exist on the area of the heating surface 2a in which the projected heating element 6A or 6B exists. That is, the area in which each of the projected heating elements 6A and 6B exists is placed on space 5B between the embossed portions.

In another preferred embodiment of the present invention, a plurality of heating elements are buried in the substrate. Each of the heating elements is buried along each of respectively corresponding planes. When the heating elements are projected on the heating surface in a direction perpendicular to the heating surface, they exist in mutually different positions (positions without overlapping). In this case, the embossed portions are fabricated on the space of the heating surface between each of the heat spot since the heat spot appear on the heating surface along shapes corresponding to each of the buried beating elements.

The ceramic heater 1E shown in FIG. 6 represents the above embodiment. A plurality of, for example, two lines of heating elements 6C and 6D are buried in the substrate 2. Each of the heating elements 6C and 6D is buried in the substrate to stretch along a plane A or B, respectively, which planes are parallel to each other. Each of the heating elements 6C and 6D is connected to an electric power source 11 or 12 via a terminal 9 or 10, respectively.

In this embodiment, when the heating elements 6C and 6D are projected on the heating surface 2a in a direction C perpendicular to the heating surface 2a, the projected heating elements 6C and 6D exist in mutually different positions (positions without overlapping) on the heating surface 2a. When the heating elements 6C and 6D are projected on the heating surface 2a according to the present invention, the embossed portion do not exist on the area of the heating surface 2a in which the projected heating element 6C or 6D exists, and the area in which each of the projected heating elements 6C and 6D exists is located on the space 5D between the embossed portions.

A height of each of the embossed portions 4 is preferably 5–500 μm from the standpoint of inhibiting an effect of the heat spot on the objects.

In the present invention, although a diameter φ of each of the embossed portions can be varied, the diameter φ is preferably 0.2–10 mm from the standpoint of a uniform temperature distribution of the object.

In addition, each of the embossed portions may be varied in a two-dimensional shape and a two-dimensional size. For example, a shape of a surface of the embossed portions which are to contact with the object may be polygonal such as triangle, tetragonal or hexagonal, ring or strip. Moreover, the number of the embossed portions is not particularly restricted. However, 0.0025–0.32 pieces/mm$^2$ is the particularly preferred number of the embossed portions per unit area from the standpoint of ensuring a uniform suction force against the object, especially against a substrate for manufacturing a semiconductor wafer or a semiconductor of a LCD panel, throughout the surface of the object.

The dimensions of each of the embossed portions, such as the height, are measured with a dial gauge or a three-dimensional shape-measuring device.

Generally, a material of the ceramic heater 2 is not restricted, an aluminum nitride base ceramic, a composite material containing aluminum nitride, an alumina base ceramic, a composite material containing alumina, and a composite ceramic of alumina and aluminum nitride are preferred from the standpoint of further reducing a generation of particle.

A material of the embossed portions is not particularly restricted, but an aluminum nitride base ceramic, a composite material containing aluminum nitride, an alumina base ceramic, a composite material containing alumina, and a composite ceramic of alumina and aluminum nitride are preferred from the standpoint of further reducing a generation of particle. The embossed portions are fabricated with a blast process, a CVD process or the like.

A material of the heating element is also not restricted. A conductive ceramic or a metal may be used, and preferably a high-melting point metal, and more preferably molybdenum, tungsten and an alloy thereof may be used.

In the present invention, a hollow space can be provided between the heating surface and the heating element in the substrate of the ceramic heater and a plurality of heat conductors can be provided in the space to transverse the space. It had not been known that the heat conduction is facilitated by providing heat conductors at some areas in the air gap, as well as the heat conduction in the substrate is inhibited by forming the air gap in the substrate, thereby inhibiting the generation of the heat spot.

In a case where the aforementioned space does not exist in the substrate and the heat spot having a relatively high surface temperature exist on the heating surface when the average temperature of the heating surface is raised to reach the target temperature, it is particularly advantageous to form the aforementioned space and heat conductors according to the present invention. In this case, the ceramic heater is designed so that the heat conductors are arranged in the space between the heat spot and are not located on the heat spot when the heat conductors and the heat spot are projected on the heating surface in a direction perpendicular to the heating surface.

In a preferred embodiment of the present invention, the number of the heat conductors per unit area on the hear spot is less than that on the rest of the heating surface. A ratio of the number of the heat conductors per unit area on the hear spot to the number of the heat conductors per unit area on the rest of the heating surface is preferably less than 1/3 to acquire the effect of the present invention.

More preferably, the heating elements are buried in planar forms in the substrate, and the heat conductors are formed in the space between the heating elements when the heat conductors and the heating elements are projected on the heating surface in a direction perpendicular to the heating surface.

Figure 7A:
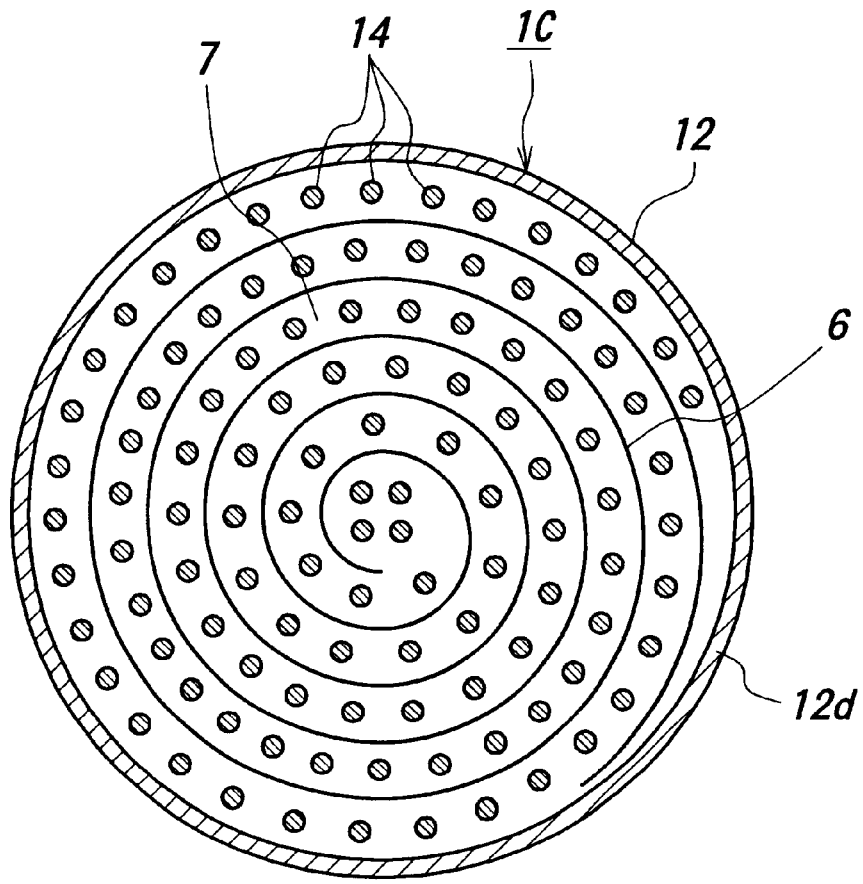
FIG. 7(*a*) is a plane view of a ceramic heater 1C.
Figure 7B:
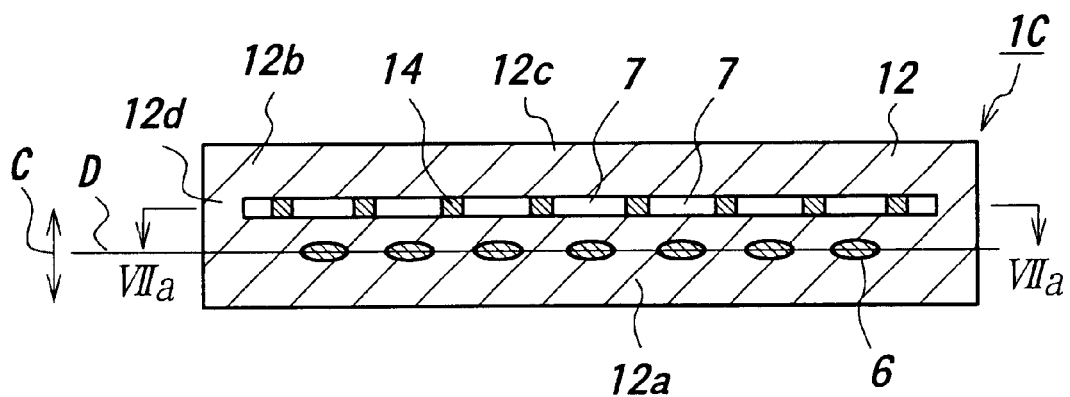

FIGS. 7(a) and (b) show the ceramic heater 1C representing the above embodiment. FIG. 7(a) is a cross-sectional view of the ceramic heater 1C, and FIG. 7(b) is a vertical-sectional view of the ceramic heater 1C.

A laterally extending space 7 is formed in the substrate 12 of the ceramic heater 1C. The substrate 12 is divided into a supporting portion 12a and a surface layer portion 12b by the space 7. The heating element 6 is formed in the supporting portion 12a. The heating surface 12c is provided on the surface layer portion 12b. The heat conductors 14 are formed at given places in the space 7, and the supporting portion 12a and the surface layer portion 12b are connected via the heat conductors 14. In addition, a peripheral joint portion 12d is provided at a peripheral side face of the substrate 12, and the supporting portion 12a and the surface layer portion 12b are joined by the peripheral joint portion 12d.

The heating element 6 is buried along a plane D in the substrate 12. In FIG. 7(a), the heating element 6 is shown with dotted line. The heat conductors 14 are formed in the space of the heating element when the heat conductors 14 and the heating element 6 are projected on the heating surface 12c in a direction perpendicular to the heating surface 12c.

In a preferred embodiment, a plurality of the heating elements are buried in the substrate. Each of the heating elements is buried along each of respectively corresponding planes. When the heating elements are projected on the heating surface in a direction perpendicular to the hearing surface, they overlap each other to exist nearly in the same position. In this case, since the heat spat occurs at the same area on the beating surface as each of the projected heating elements exists, a heat conduction in the substrate is inhibited by avoiding the areas from existing the heat conductors.

In another preferred embodiment, a plurality of the heating elements are buried in the substrate. Each of the heating elements is buried along each of respectively corresponding planes. When the heating elements are projected on the heating surface in a direction perpendicular to the heating surface, they exist in mutually different positions (positions without overlapping). In this case, the mutually independent heat spots corresponding to each of the heating elements occur at mutually independent positions. Therefore, the heat conduction in the substrate is inhibited by avoiding the areas from existing the heat conductors.

The pressure in the space is particularly preferably set to not more than 3 torr. This inhibits convective heat conduction in the space to give radiant heat conduction as a dominant condition, so the heat spot can be effectively prevented.

A material of the heat conductors is not particularly restricted, but preferably the same material as that of the substrate. Aluminum nitride base ceramic, a composite material containing aluminum nitride, alumina base ceramic, a composite material containing alumina, and a composite ceramic of alumina and aluminum nitride are preferred for the material.

(Preferred Embodiment)
(Experiment 1)

Ceramic heaters schematically shown in FIGS. 3-5 were manufactured. Specifically, aluminum nitride powder obtained by a reduction nitriding process were used, an acrylic resin binder was added therein, and then the mixture was granulated by a spray dryer, thereby obtaining granulated grains. Three sheets of molded bodies were sequentially made by uniaxially press-molding the granulated grains, and then each of the three layers of molded bodies was stacked on top of another to make them a single piece. Coil-like resistance-heating elements 6A and 6B made of molybdenum were buried in the uniaxially press-molded body.

The molded body was placed in a hot press mold, which was hermetically sealed. The molded body was heated at a heating rate of 300° C./hr. while the pressure was reduced in a temperature range from the room temperature to 1,000° C. After the temperature reached at 1,000° C., the pressure was simultaneously increased with increase in the temperature. The maximum temperature was 1,800° C., and the molded body was held and fired at the maximum temperature under 200 kgf/cm$^2$ for 4 hours in nitrogen gas to obtain a sintered body. Then the sintered body was subjected to a machine work and a finish machining, thereby a heater was prepared. The diameter and the thickness of a substrate 2 were set to 240 mm and 18 mm, respectively. The clearance between the resistance-heating elements 6A and 6B was set to 5.5 mm.

The surface of the substrate 2 was sandblasted to fabricate the embossed portions 4. The height, the diameter and the density of the embossed portions 4 were set to 20 $\mu$m, 3 mm and 1.5 pieces/cm$^2$, respectively. The average temperature of the heating surface of the heating apparatus was set to about 650° C. by controlling power supply from each AC power source. The pressures in the chamber were set to high vacuum, 3 torr, 30 torr and 50 torr.

Then, a silicon wafer was placed still on the heating surface, and silane gas was supplied to form a semiconductor film on the silicon wafer. The semiconductor film was made of, for example, TiN, SiO$_2$, low-K material, Si$_3$N$_4$, Ta$_2$O$_3$ or the like, and was used as a metal wiring film, insulating film, barrier film, electrode, capacitor, or the like. A surface state of the thus obtained silicon surface was observed. As a result, when the pressure in the chamber was high vacuum or 3 torr, a pattern of the semiconductor film corresponding to the heating elements was not observed at all. When the pressure was 30 torr or 50 torr, a pattern of the semiconductor film corresponding to the heating elements was observed in some degree. Thus, a further detailed investigation was conducted, and a thickness distribution was measured between the adjacent patterns to give a variation of not more than 1%. This level was not more than a half of the film thickness distribution over the entire wafer, so it is practically not a problem.

(Experiment 2)

Ceramic heaters were manufactured and patterns on the semiconductor film were observed in the same manner as Experiment 1 except that the heating elements 6A and 6B having patterns shown in FIGS. 4 and 5 were used. In addition, the embossed portions on the heating surface were arranged in a completely random pattern so that the embossed portions were located above the heating elements also. At the same time, the space 7 and the heat conductors 14 having shapes shown in FIGS. 7(*a*) and (*b*) were used. The heat conductors 14 were also made of aluminum nitride. The thickness and the diameter of the space 7 were set to 2 mm and 210 mm, respectively, and the diameter of the heat conductors 14 was set to 6 mm. Each pressure in the chamber was set to high vacuum, 3 torr, 30 torr, 50 torr and 150 torr.

As a result, a pattern of the semiconductor film corresponding to the heating elements was not observed under any pressure conditions.

(Experiment 3)

Experiment 2 was repeated except that the space 7 and the conductors 14 were not provided. The pressure in the chamber at the time of measuring was set to high vacuum, 3 torr, 30 torr, 50 torr and 150 torr.

As a result, patterns of the semiconductor film corresponding to the heating element were obviously seen on the appearances of the semiconductor film under all pressure conditions.

As having been described in the above, according to the present invention, a ceramic heater comprising a ceramic substrate having a heating surface for supporting and heating an object to be processed, a heating element provided in the substrate, and embossed portions on the heating surface which are to contact with the objects is provided, thereby preventing an adverse effect on the objects caused by a heat spot on the heating surface.

While a preferred embodiment of the present invention has been described, it is to be understood that modifications and variations may be made without departing from the sprit of the invention. The cope of the invention, therefore, is to be determined only by the following claims.

What is claimed is:

1. A ceramic heater comprising a ceramic substrate having a heating surface for supporting and hearing an object to be processed, a heating element provided in the substrate, and embossed portions on the heating surface which contact the object, wherein a heat spot having a relatively high surface temperature exists on the heating surface and the number of the embossed portions per unit area on the heat spot is less than tat on the rest of the heating surface when an average temperature of the healing surface is raised to reach a target temperature.

2. A ceramic heater comprising a ceramic substrate having a heating surface for supporting and heating an object to be processed, a heating element provided in the substrate, and embossed portions on the heating surface which contact the object, wherein the heating element is provided in a planar form in the substrate and the embossed portions project on the heating surface in a direction perpendicular to the heating surface, and the number of the embossed portions per unit area on the heating element is less than that on the rest of the heating surface.

3. A ceramic heater as claimed in claim 2, wherein a plurality of said heating elements are buried in said substrate, each of said heating elements is buried along each of respectively corresponding planes, and when said heating elements are projected on said heating surface in a direction perpendicular to said heating surface, said projected heating elements overlap each other to exist nearly in the same position.

4. A ceramic heater as claimed in claim 2, wherein a plurality of said heating elements are buried in said substrate, each of said heating elements is buried along each of respectively corresponding planes and when said heating elements are projected on said heating surface in a direction perpendicular to said heating surface, said projected heating elements exist in mutually different areas.

5. A ceramic heater comprising a ceramic substrate having a heating surface for supporting and heating an object to be processed, and a heating element provided in the substrate, wherein a hollow space is provided between the heating surface and the heating element in the substrate and a plurality of heat conductors are provided in the space to transverse the space, wherein said heating element is provided in a planar form in said substrate and when said heat conductors and said heating element are projected on said heating surface in a direction perpendicular to said heating surface, the number of said embossed portions per unit area on said projected heating element is less than that on the rest of said heating surface.

6. A ceramic heater as claimed in claim 5 wherein if said space does not exist in said substrate and the average temperature of said heating surface is raised to reach a target temperature, a heat spot having a relatively high surface temperature exists on said heating surface, and when said heat conductors and the heat spot are projected on said heating surface in a direction perpendicular to said heating surface, the number of the heat conductors per unit area on the projected heat spot is less than that an the rest of said heating surface.

7. A ceramic heater as claimed in claim 6, wherein the pressure in said space is not more than 3 torr.

8. A ceramic heater as claimed in claim 5, wherein a plurality of said heating elements are buried in said substrate, each of said heating elements is buried along each of respectively corresponding planes, and when said heating elements are projected on said heating surface in a direction perpendicular to said heating surface, said projected heating elements overlap each other to exist nearly in the same position.

9. A ceramic heater as claimed in claim 8, wherein the pressure in said space is not more than 3 torr.

10. A ceramic heater as claimed in claim 5, wherein a plurality of said heating elements are buried in said substrate, each of said heating elements is buried along each of respectively corresponding planes, and when said heating elements are projected on said heating surface in a direction perpendicular to said heating surface, said projected heating elements in mutually different positions.

11. A ceramic heater as claimed in claim 10, wherein the pressure in said space is not more than 3 torr.

12. A ceramic heater as claimed in claim 5, wherein the pressure in said space is not more than 3 torr.

* * * * *

UNITED STATES PATENT AND TRADEMARK OFFICE
CERTIFICATE OF CORRECTION

PATENT NO. : 6,558,158 B2
DATED : May 6, 2003
INVENTOR(S) : Shinji Yamaguchi

It is certified that error appears in the above-identified patent and that said Letters Patent is hereby corrected as shown below:

<u>Title page,</u>
Item [57], ABSTRACT,
Line 3, please change "hearing" to -- heating --.

<u>Column 8,</u>
Line 21, please change "hearing" to -- heating --.
Line 27, please change "tat" to -- that --.
Line 28, please change "healing" to -- heating --.

Signed and Sealed this

First Day of July, 2003

JAMES E. ROGAN
*Director of the United States Patent and Trademark Office*